United States Patent
Hiraoka

(10) Patent No.: US 7,569,649 B2
(45) Date of Patent: Aug. 4, 2009

(54) FILM FORMING COMPOSITION, INSULATING FILM, AND ELECTRONIC DEVICE

(75) Inventor: Hidetoshi Hiraoka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/854,821

(22) Filed: Sep. 13, 2007

(65) Prior Publication Data

US 2008/0076888 A1 Mar. 27, 2008

(30) Foreign Application Priority Data

Sep. 27, 2006 (JP) .............................. 2006-263358

(51) Int. Cl.
*C08F 236/04* (2006.01)
*C08L 49/00* (2006.01)
*B32B 13/12* (2006.01)

(52) U.S. Cl. .................. 526/282; 526/279; 526/280; 526/285; 525/313; 524/550; 524/553; 524/554; 585/22; 585/352

(58) Field of Classification Search ................ 526/279, 526/280, 282, 285; 524/550, 553, 554; 525/313; 585/22, 352
See application file for complete search history.

(56) References Cited

U.S. PATENT DOCUMENTS

| | | | | | |
|---|---|---|---|---|---|
| 3,580,964 | A | * | 5/1971 | Driscoll ........................ | 525/40 |
| 3,639,362 | A | * | 2/1972 | Duling et al. ................ | 526/282 |
| 4,942,210 | A | * | 7/1990 | Kuntz ........................ | 526/348.7 |
| 5,462,680 | A | * | 10/1995 | Brois et al. ................. | 508/110 |
| 5,759,725 | A | * | 6/1998 | Hirao et al. ................. | 430/58.1 |
| 2004/0033381 | A1 | * | 2/2004 | Aoi ............................ | 428/515 |

FOREIGN PATENT DOCUMENTS

| | | | |
|---|---|---|---|
| EP | 1 605 016 A2 | 12/2005 |
| JP | 11-329080 A | 11/1999 |

* cited by examiner

*Primary Examiner*—Fred M Teskin
(74) *Attorney, Agent, or Firm*—Sughrue Mion, PLLC

(57) ABSTRACT

A film forming composition includes a compound having a cage structure; and a compound having a conjugated diene structure.

4 Claims, No Drawings

FILM FORMING COMPOSITION, INSULATING FILM, AND ELECTRONIC DEVICE

BACKGROUND OF THE INVENTION

1. Field of the Invention

The present invention relates to an insulating film forming composition, more specifically to a composition capable of forming an insulating film to be used in electronic devices and the like and good in film properties such as dielectric constant and mechanical strength. The invention also pertains to a forming process of the insulating film and an electronic device having the insulating film.

2. Description of the Related Art

In recent years, with the progress of high integration, multifunction and high performance in the field of electronic materials, circuit resistance and condenser capacity between interconnects have increased and have caused an increase in electric power consumption and delay time. Particularly, the increase in delay time becomes a large factor for reducing the signal speed of devices and generating crosstalk. Reduction of parasitic resistance and parasitic capacity are therefore required in order to reduce this delay time, thereby attaining speed-up of devices. As one of concrete measures for reducing this parasitic capacity, an attempt has been made to cover the periphery of an interconnect with a low dielectric interlayer insulating film. The interlayer insulating film is expected to have excellent heat resistance in a thin film formation step when a printed circuit board is manufactured or in post steps such as chip connection and pin attachment and also chemical resistance sufficient to withstand the wet process. In addition, a low resistance Cu interconnect has been introduced in recent years instead of an Al interconnect, and along with this, CMP (chemical mechanical polishing) has been employed commonly for planarization. Accordingly, an insulating film having mechanical strength great enough to withstand this CMP is required.

Highly heat-resistant interlayer insulating films such as polybenzoxazole, polyimide, polyarylene(ether) and the like have been disclosed for long years. Materials having a lower dielectric constant further are demanded in order to realize a high speed device. Introduction of a hetero atom such as oxygen, nitrogen or sulfur or an aromatic hydrocarbon unit into the molecule of a polymer as in the above-described materials, however, increases a dielectric constant owing to high molar polarization, causes a time-dependent increase in the dielectric constant owing to moisture absorption, or causes a trouble impairing reliability of an electronic device so that these materials need improvement.

Compared with a polymer composed of a hetero-atom-containing unit or aromatic hydrocarbon unit, a polymer composed of a saturated hydrocarbon has a smaller molar polarization so that it has advantageously a lower dielectric constant. However, a hydrocarbon such as polyethylene having high flexibility has insufficient heat resistance and therefore cannot be used for electronic devices.

Polymers having, in the molecule thereof, a saturated hydrocarbon having a rigid cage structure such as adamantane or diamantane are disclosed (EP1605016A2). Adamantane or diamantane is a preferable unit because it has a diamondoid structure and exhibits high heat resistance and low dielectric constant.

SUMMARY OF THE INVENTION

An insulating film formed using a film forming composition containing a compound having a cage structure as described in EP1605016 satisfies both a low dielectric constant and mechanical strength, but sometimes undergoes a change in dielectric constant when stored under high humidity conditions after film formation. A film forming composition capable of forming a film having improved durability is therefore required.

The invention has been made based on such a background. An object of the present invention is to resolve the time-dependent instability of a film forming composition containing a cage structure under high humidity conditions and provide a film forming composition capable of satisfying a low dielectric constant, excellent mechanical strength and durability storage stability.

Another object of the present invention is to provide an interlayer insulating film of an electronic device by using the film forming composition, and an electronic device having the insulating film as a constituent layer.

An "insulating film" is also referred to as a "dielectric film" or a "dielectric insulating film", and these terms are not substantially distinguished.

The present inventors proceeded with an investigation, presuming that there is a possibility of the polymer of a compound, that has a cage structure as described in EP1605016, having a polyene structure with a large number of double bonds, in some cases, a large number of conjugated double bonds and this may be one of the causes of the deterioration of durability of a film available from the polymer. As a result, it has been found that a decrease in dielectric constant and improvement in the durability of the polymer can be accomplished by coupling of a polymer having a polyene structure with a compound having a conjugated diene structure by a Diels-Alder reaction because the conjugated bond may be broken by this coupling. The invention has been completed based on this finding.

A using example of a Diels-Alder reaction for the formation of an insulating film is known in Japanese Patent Laid-Open No. 329080/1999, but there is no using example of it for the formation of an insulating film using a polymer having a polyene structure.

The constitution of the invention will next be described.

<1> A film forming composition comprising:

a compound having a cage structure; and a compound having a conjugated diene structure.

<2> The film forming composition as described in <1>, wherein the cage structure is a cage structure possessed by a compound selected from the group consisting of adamantane, biadamantane, diamantane, triamantane and tetramantane.

<3> The film forming composition as described in <1>, wherein the compound having a cage structure is obtained by polymerizing, in the presence of a transition metal catalyst or radical polymerization initiator, a monomer selected from the group consisting of compounds represented by the following formulas (I) to (VI):

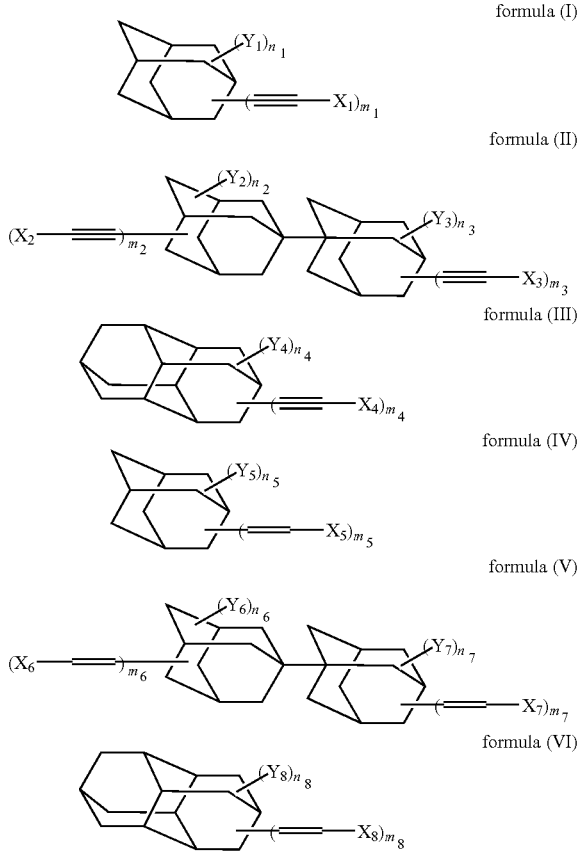

formula (I)
formula (II)
formula (III)
formula (IV)
formula (V)
formula (VI)

wherein $X_1$ to $X_8$ each independently represents a hydrogen atom, $C_{1-10}$ alkyl group, $C_{2-10}$ alkenyl group, $C_{2-10}$ alkynyl group, $C_{6-20}$ aryl group, $C_{0-20}$ silyl group, $C_{2-10}$ acyl group, $C_{2-10}$ alkoxycarbonyl group or $C_{1-20}$ carbamoyl group, $Y_1$ to $Y_8$ each independently represents a halogen atom, $C_{1-10}$ alkyl group, $C_{6-20}$ aryl group or $C_{0-20}$ silyl group, $m_1$ and $m_5$ each independently represents an integer of from 1 to 16, $n_1$ and $n_5$ each independently represents an integer of from 0 to 15, $m_2$, $m_3$, $m_6$ and $m_7$ each independently represents an integer of from 1 to 15, $n_2$, $n_3$, $n_6$ and $n_7$ each independently represents an integer of from 0 to 14, $m_4$ and $m_8$ each independently represents an integer of from 1 to 20, and $n_4$ and $n_8$ is each independently represents an integer of from 0 to 19.

<4> The film forming composition as described in <1>, wherein the compound having a cage structure has a polyene structure.

<5> The film forming composition as described in <1>, wherein the compound having a cage structure has a solubility at 25° C. of 3 mass % or greater in cyclohexanone or anisole.

<6> The film forming composition as described in <1>, further comprising:
an organic solvent.

<7> An insulating film formed by using the film forming composition as described in <1>.

<8> An electronic device comprising the insulating film as described in <7>.

DETAILED DESCRIPTION OF THE INVENTION

The invention will hereinafter be described specifically.

The film forming composition of the invention is characterized in that it has a compound having a cage structure and a compound having a conjugated diene structure. Addition of the compound having a conjugated diene structure contributes to the formation of a film having improved durability and suppresses deterioration of properties such as change in dielectric constant that occurs during steps such as photolithography and CMP.

<Compound Having a Cage Structure>

The term "cage structure" as used herein means a "cage-shaped polycyclic carbon ring structure", more specifically, a carbon ring structure whose space is defined by a plurality of carbon rings formed by covalent-bonded atoms and a point existing within the space cannot depart from the space without passing through these rings. For example, an adamantane structure may be considered as the cage structure. Contrary to this, a cyclic structure having a single crosslink, for example, norbornane (bicyclo[2,2,1]heptane) cannot be considered as the cage structure because it is a polycyclic carbon ring structure but the ring of the single-crosslinked cyclic compound does not define the space of the compound.

The cage structure according to the invention may have one or more substituents. Examples of the substituents include halogen atoms (fluorine, chlorine, bromine and iodine), linear, branched or cyclic $C_{1-10}$ alkyl groups (such as methyl, t-butyl, cyclopentyl and cyclohexyl), $C_{2-10}$ alkenyl groups (such as vinyl and propenyl), $C_{2-10}$ alkynyl groups (such as ethynyl and phenylethynyl), $C_{6-20}$ aryl groups (such as phenyl, 1-naphthyl and 2-naphthyl), $C_{2-10}$ acyl groups (such as benzoyl), $C_{6-20}$ aryloxy groups (such as phenoxy), $C_{6-20}$ arylsulfonyl groups (such as phenylsulfonyl), nitro group, cyano group, and silyl groups (such as triethoxysilyl, methyldiethoxysilyl and trivinylsilyl). Of these, fluorine atom, bromine atom, linear, branched or cyclic $C_{1-5}$ alkyl groups, $C_{2-5}$ alkenyl groups, $C_{2-5}$ alkynyl groups and silyl groups are preferred. These substituents may be substituted with another substituent.

In the invention, the cage structure is preferably monovalent, divalent, trivalent or tetravalent, more preferably divalent, trivalent or tetravalent. In this case, a group to be coupled to the cage structure may be a monovalent or polyvalent substituent or a polyvalent linking group.

In the invention, the cage structure may be incorporated as a monovalent or polyvalent pendant group in the polymer main chain. The preferable polymer main chain to which the cage structure is bonded is, for example, a conjugated unsaturated bond chain such as poly(arylene), poly(arylene ether), poly(ether) or polyacetylene, or polyethylene. Of these, poly(arylene ether) or polyacetylene is more preferred for its superior heat resistance.

The cage structure in the invention preferably constitutes a portion of the polymer main chain. When the cage structure constitutes a portion of the polymer main chain, the polymer chain is broken by the removal of the cage compound from the polymer. In this mode, the cage structures may be directly single-bonded or linked via an appropriate divalent linking group. Example of the linking group include —C($R_1$)($R_2$)—, —C($R_3$)=C($R_4$)—, —C≡C—, arylene group, —CO—, —O—, —$SO_2$—, —N($R_5$)—, and —Si($R_6$)($R_7$)—, and combinations thereof. In these groups, $R_1$ to $R_7$ each independently represents a hydrogen atom, an alkyl group, an alkenyl group, an alkynyl group, an aryl group or an alkoxy group. These linking groups may be substituted by a substituent and the above-described substituents are preferably employed as it.

Of these linking groups, —C($R_1$)($R_2$)—, —CH=CH—, —C≡C—, arylene group, —O— and —Si($R_6$)($R_7$)—, and combinations thereof are more preferred, with —CH=CH—, —C≡C—, —O— and —Si($R_6$)($R_7$)—, and combinations thereof being especially preferred.

The "compound having a cage structure" to be used in the invention may contain, in the molecule thereof, one or more than one cage structure.

The cage structure in the invention may have been substituted as a pendant group in the polymer or may constitute a portion of the polymer main chain, but latter is preferred.

The compound having a cage structure according to the invention may be either a low molecular compound or high molecular compound (for example, polymer), but is preferably a polymer. When the compound having a cage structure is a polymer, its weight average molecular weight is preferably from 1,000 to 500,000, more preferably from 5,000 to 200,000, especially preferably from 10,000 to 100,000. The polymer having a cage structure may be contained in a film forming composition as a resin composition having a molecular weight distribution. When the compound having a cage structure is a low molecular compound, on the other hand, its molecular weight is preferably from 150 to 3,000, more preferably from 200 to 2,000, especially preferably from 220 to 1,000.

The compound having a cage structure according to the invention is preferably a polymer of a monomer having at least one, preferably two or more polymerizable carbon-carbon double bonds or carbon-carbon triple bonds.

The compound having a cage structure according to the invention is especially preferably a polymer of a compound having a molecular structure shown below.

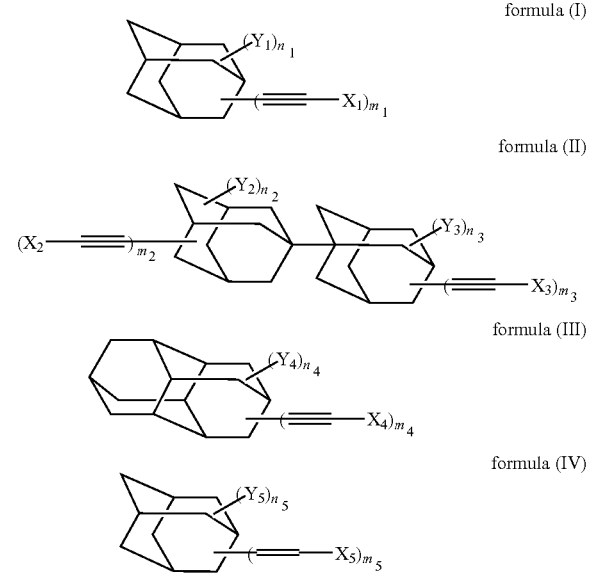

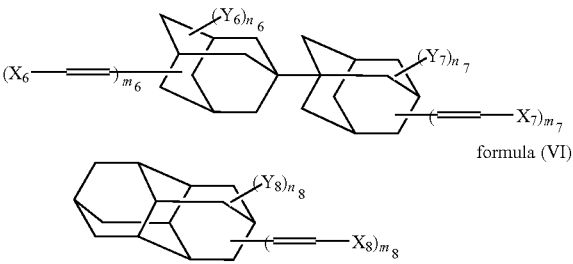

In the formulas (I) to (VI), $X_1$ to $X_8$ each independently represents a hydrogen atom, an alkyl group (preferably, a $C_{1-10}$ alkyl group), an alkenyl group (preferably, $C_{2-10}$ alkenyl group), an alkynyl group (preferably, $C_{2-10}$ alkynyl group), an aryl group (preferably, $C_{6-20}$ aryl group), a silyl group (preferably, $C_{0-20}$ silyl group), an acyl group (preferably, $C_{2-10}$ acyl one), an alkoxycarbonyl group (preferably, $C_{2-10}$ alkoxycarbonyl group), or a carbamoyl group (preferably, $C_{1-20}$ carbamoyl group), of which hydrogen atom, $C_{1-10}$ alkyl group, $C_{6-20}$ aryl group, $C_{0-20}$ silyl group, $C_{2-10}$ acyl group, $C_{2-10}$ alkoxycarbonyl group, or $C_{1-20}$ carbamoyl group is preferred; hydrogen atom or $C_{6-20}$ aryl group is more preferred; and hydrogen atom is especially preferred.

$Y_1$ to $Y_8$ each independently represents an alkyl group (preferably, $C_{1-10}$ alkyl group), an aryl group (preferably, $C_{6-20}$ aryl group), or a silyl group (preferably, $C_{0-20}$ silyl group), of which an optionally substituted $C_{1-10}$ alkyl group or $C_{6-20}$ aryl group is more preferred and an alkyl(methyl or the like) group is especially preferred.

$X_1$ to $X_8$ and $Y_1$ to $Y_8$ may each be substituted by another substituent and in this case, the substituents described above as $X_1$ to $X_8$ and $Y_1$ to $Y_8$ are preferred.

In the above formulas, $m_1$ and $m_5$ each independently stands for an integer from 1 to 16, preferably from 1 to 4, more preferably from 1 to 3, especially preferably 2;

$n_1$ and $n_5$ each independently stands for an integer from 0 to 15; preferably from 0 to 4, more preferably 0 or 1, especially preferably 0;

$m_2$, $m_3$, $m_6$ and $m_7$ each independently stands for an integer from 1 to 15; preferably from 1 to 4, more preferably from 1 to 3, especially preferably 2;

$n_2$, $n_3$, $n_6$ and $n_7$ each independently stands for an integer from 0 to 14; preferably from 0 to 4, more preferably 0 or 1, especially preferably 0;

$m_4$ and $m_8$ each independently stands for an integer from 1 to 20; preferably from 1 to 4, more preferably from 1 to 3, especially preferably 2; and $n_4$ and $n_8$ each independently stands for an integer from 0 to 19, preferably from 0 to 4, more preferably 0 or 1, especially preferably 0.

The monomer having a cage structure according to he invention is preferably a compound represented by the above-described formula (II), (III), (V) or (VI), more preferably a compound represented by the formula (II) or (III), especially preferably a compound represented by the formula (III).

Two or more of the compounds having a cage structure according to the invention may be used in combination. Two or more of the monomers having a cage structure according to the invention may be copolymerized.

The compound having a cage structure according to the invention preferably has a polyene structure. The compound having both a cage structure and a polyene structure can be obtained, for example, by radical polymerization of a monomer having a carbon-carbon triple bond.

Specific examples of the monomer having a cage structure and usable in the invention include, but are not limited to, the following ones. The present invention can also be applied to compounds having, as one portion thereof, the following structure.

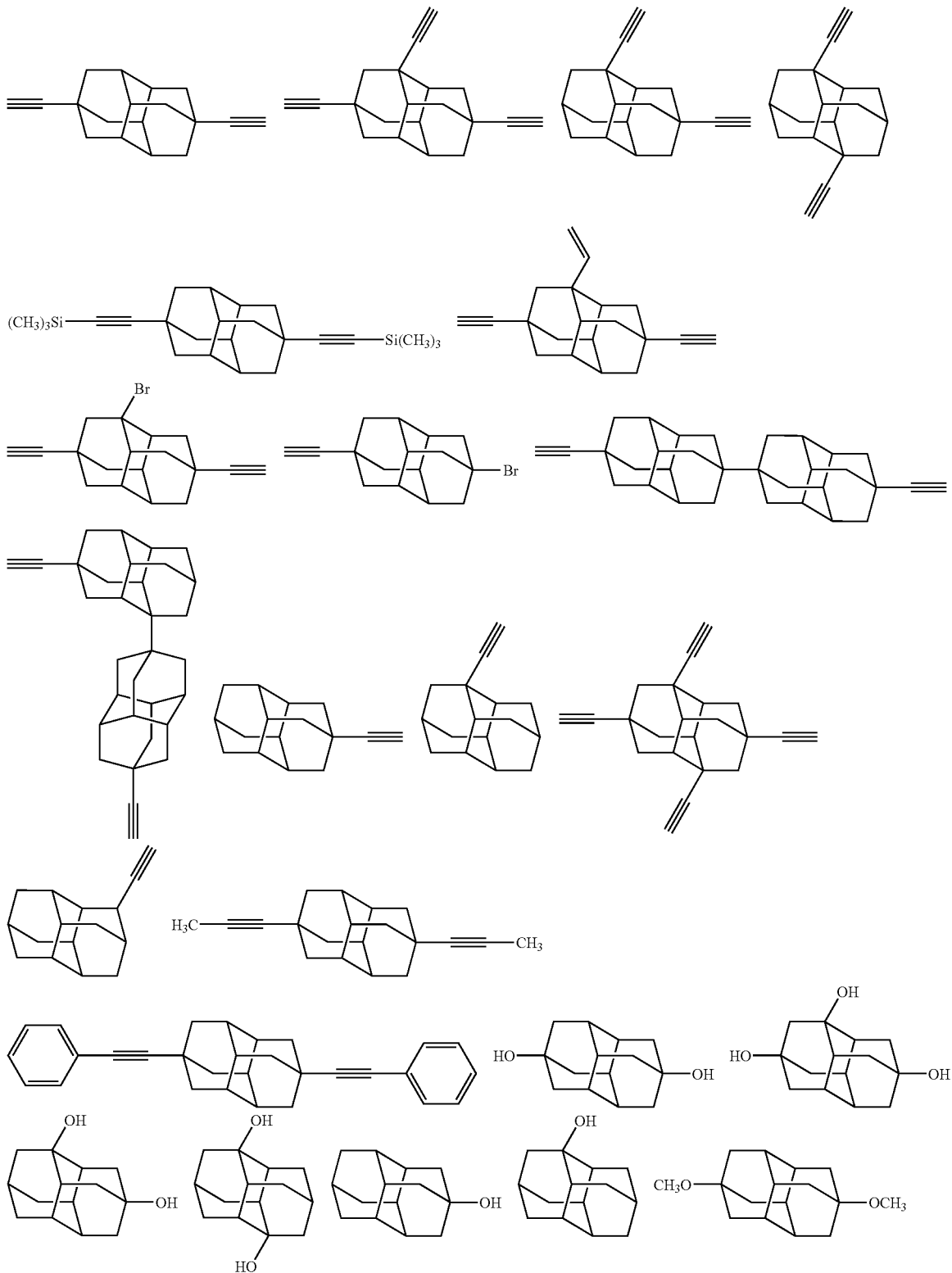

-continued
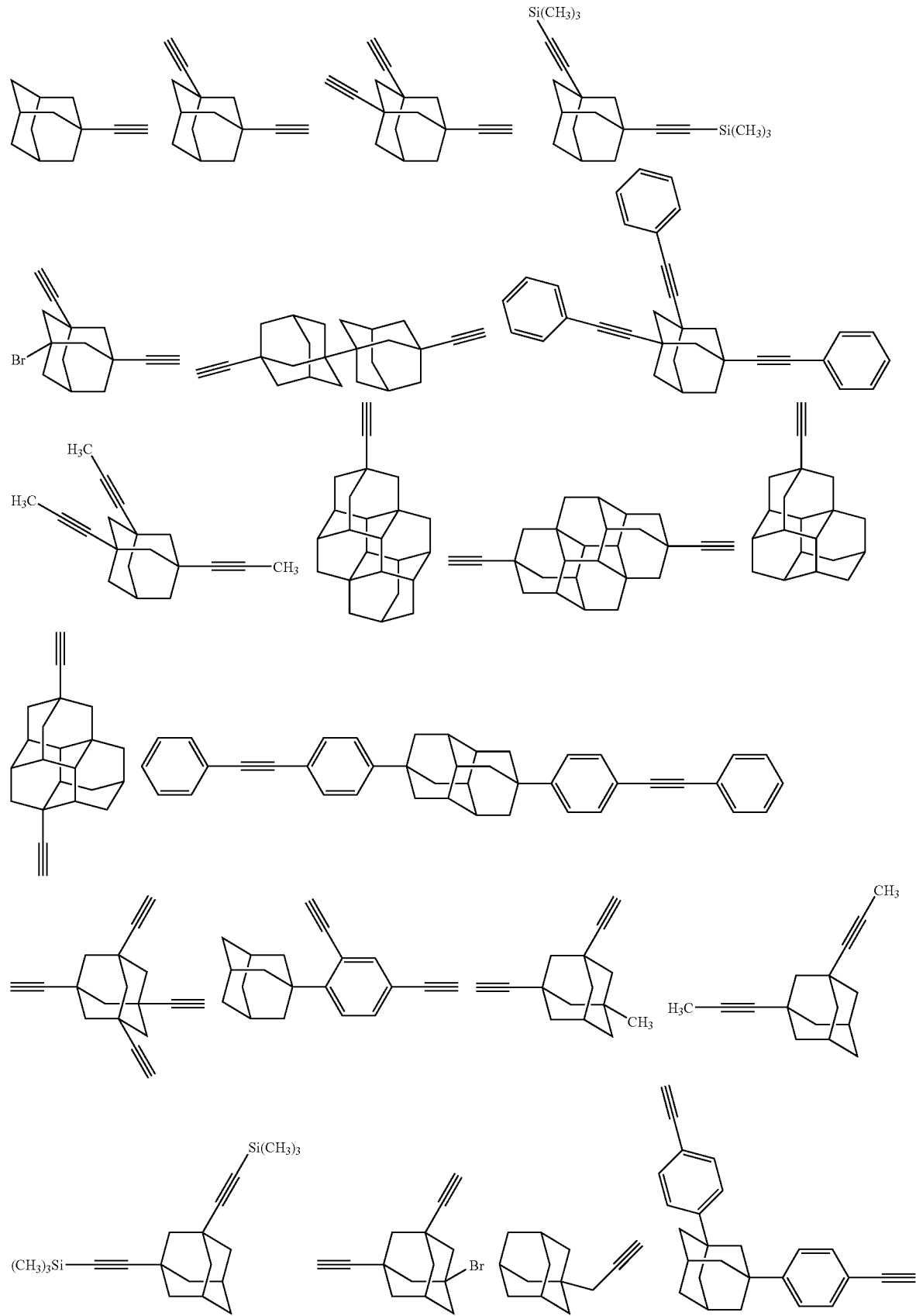

-continued
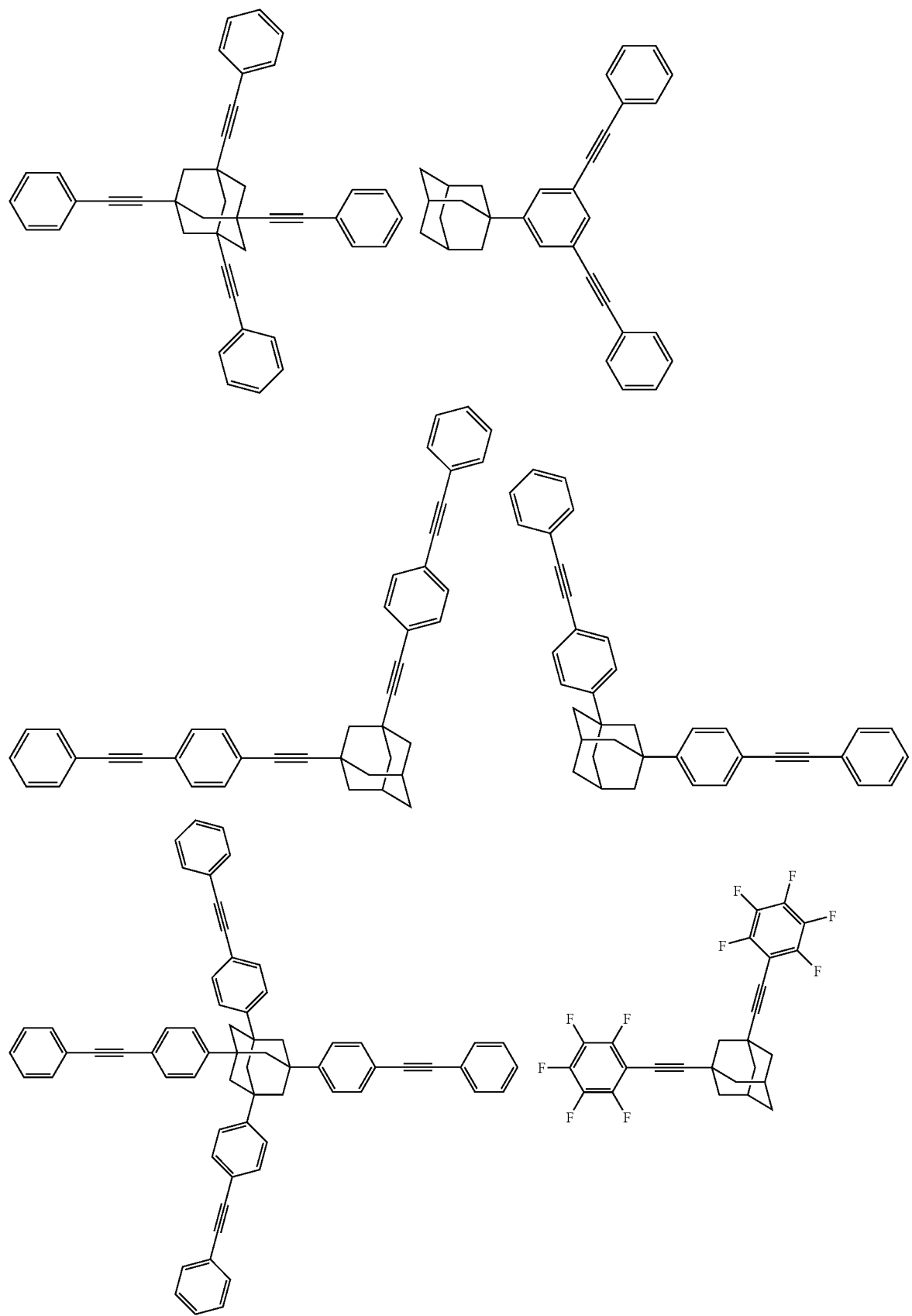

-continued
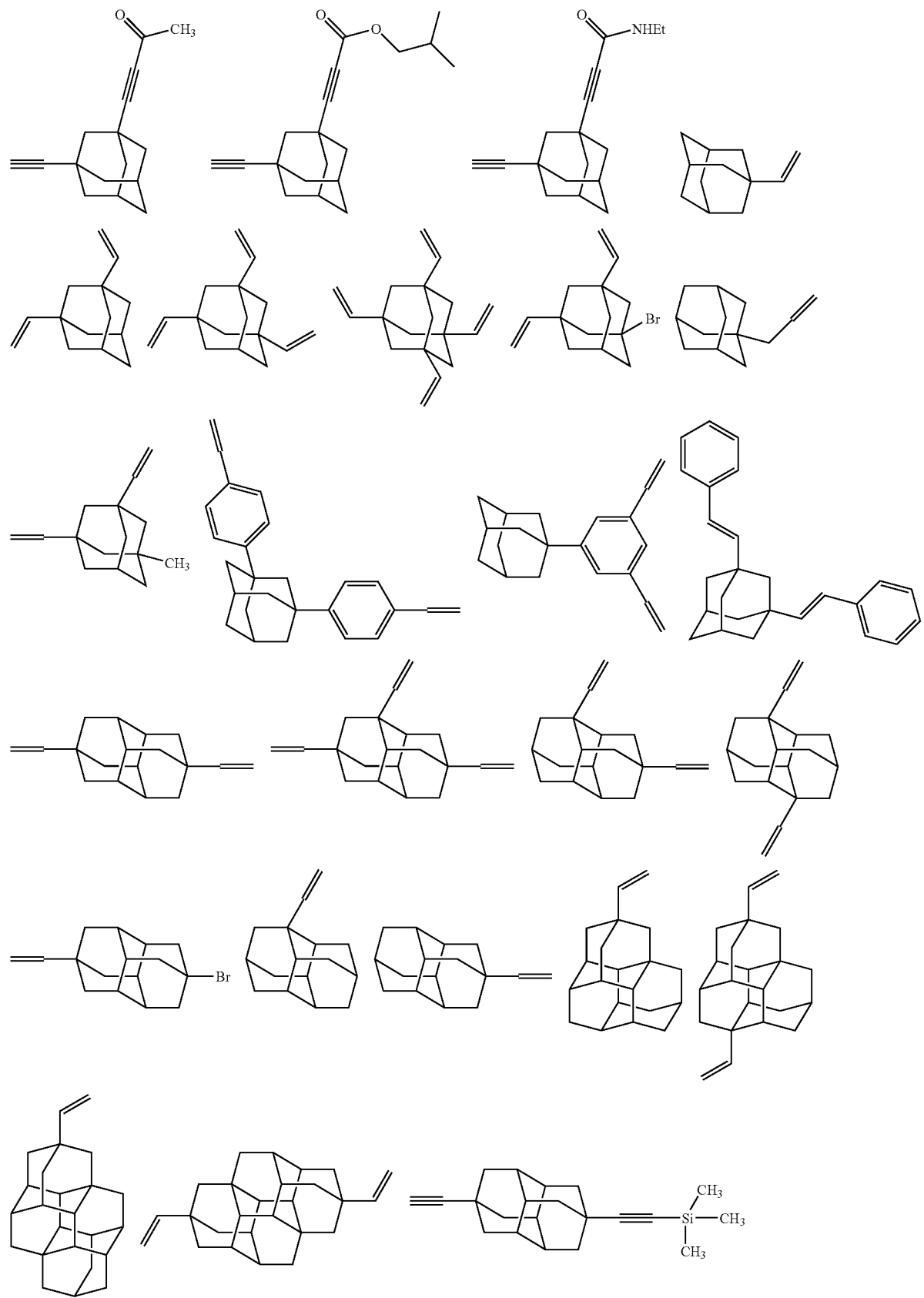

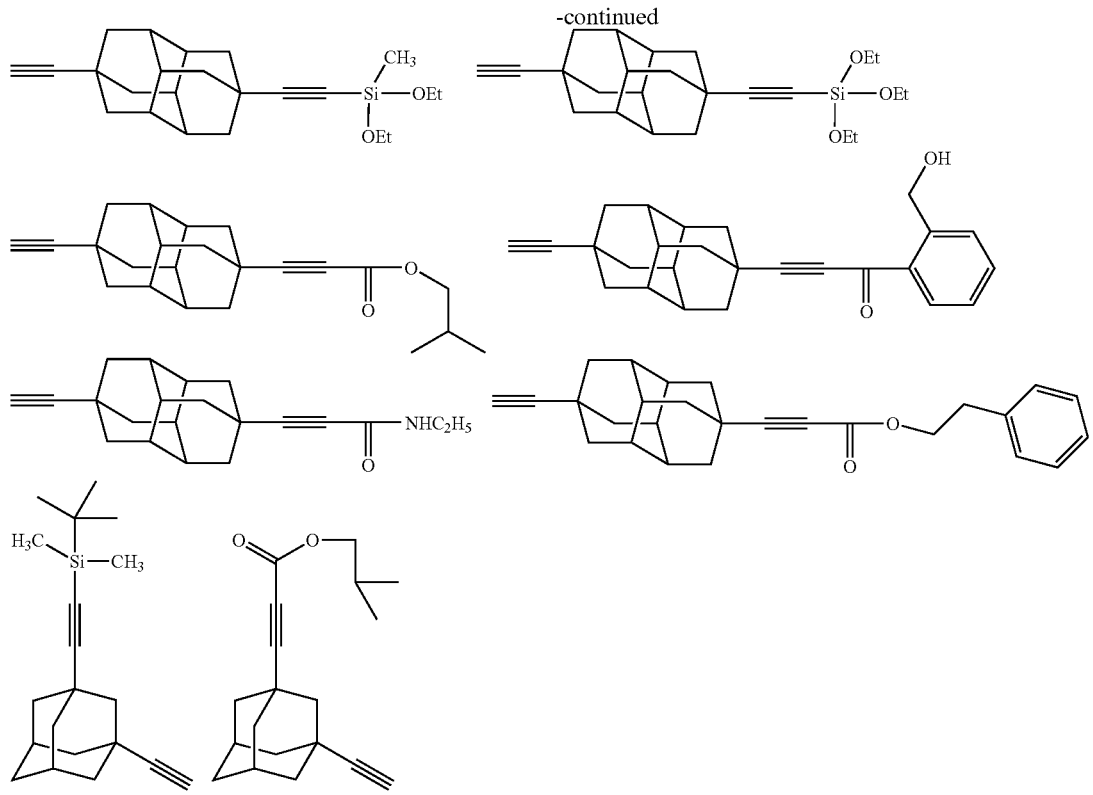

In the invention, the polymerization reaction of a monomer occurs by a polymerizable group substituted for the monomer. Although any polymerization reaction can be employed, examples include radical polymerization, cationic polymerization, anionic polymerization, ring-opening polymerization, polycondensation, polyaddition, addition condensation, polymerization in the presence of a transition metal catalyst and oxidative coupling.

Polymerization reaction preferable in the invention, is, for example, polymerization of an alkenyl- or alkynyl-containing monomer in the presence of a non-metallic polymerization initiator that generates, by heating, free radicals such as carbon radicals or oxygen radicals and initiates polymerization.

As the polymerization initiator, organic peroxides and organic azo compounds are especially preferred.

Preferred examples of the organic peroxides include ketone peroxides such as "PERHEXA H", peroxyketals such as "PERHEXA TMH", hydroperoxides such as "PERBUTYL H-69", dialkylperoxides such as "PERCUMYL D", "PERBUTYL C" and "PERBUTYL D", diacyl peroxides such as "NYPER BW", peroxy esters such as "PERBUTYL Z" and "PERBUTYL L", and peroxy dicarbonates such as "PEROYL TCP", (each, trade name; commercially available from NOF Corporation), diisobutyryl peroxide, cumylperoxyneodecanoate, di-n-propylperoxydicarbonate, diisopropylperoxydicarbonate, di-sec-butylperoxydicarbonate, 1,1,3,3-tetramethylbutylperoxyneodecanoate, di(4-t-butylchlorohexyl)peroxydicarbonate, di(2-ethylhexyl)peroxydicarbonate, t-hexylperoxyneodecanoate, t-butylperoxyneodecanoate, t-butylperoxyneoheptanoate, t-hexylperoxypivalate, t-butylperoxypivalate, di(3,5,5-trimethylhexanoyl)peroxide, dilauroyl peroxide, 1,1,3,3-tetramethylbutylperoxy-2-ethylhexanoate, disuccinic acid peroxide, 2,5-dimethyl-2,5-di(2-ethylhexanoylperoxy)hexane, t-hexylperoxy-2-ethylhexanoate, di(4-methylbenzoyl)peroxide, t-butylperoxy-2-ethylhexanoate, di(3-methylbenzoyl)peroxide, benzoyl(3-methylbenzoyl)peroxide, dibenzoyl peroxide, 1,1-di(t-butylperoxy)-2-methylcyclohexane, 1,1-di(t-hexylperoxy)-3,3,5-trimethylcyclohexane, 1,1-di(t-hexylperoxy)cyclohexane, 1,1-di(t-butylperoxy)cyclohexane, 2,2-di(4,4-di-(t-butylperoxy)cyclohexyl)propane, t-hexylperoxyisopropyl monocarbonate, t-butylperoxymaleic acid, t-butylperoxy-3,5,5-trimethylhexanoate, t-butylperoxylaurate, t-butylperoxyisopropylmonocarbonate, t-butylperoxy-2-ethylhexylmonocarbonate, t-hexylperoxybenzoate, 2,5-dimethyl-2,5-di(benzoylperoxy)hexane, t-butylperoxyacetate, 2,2-di-(t-butylperoxy)butane, t-butylperoxybenzoate, n-butyl-4,4-di-t-butylperoxyvalerate, di(2-t-butylperoxyisopropyl)benzene, dicumyl peroxide, di-t-hexyl peroxide, 2,5-dimethyl-2,5-di(t-butyl peroxy)hexane, t-butylcumyl peroxide, di-t-butyl peroxide, p-methane hydroperoxide, 2,5-dimethyl-2,5-di(t-butylperoxy)hexine-3, diisopropylbenzene hydroperoxide, 1,1,3,3-tetramethylbutyl hydroperoxide, cumene hydroperoxide, t-butyl hydroperoxide, 2,3-dimethyl-2,3-diphenylbutane, 2,4-dichlorobenzoyl peroxide, o-chlorobenzoyl peroxide, p-chlorobenzoyl peroxide, tris-(t-butylperoxy)triazine, 2,4,4-trimethylpentylperoxyneodecanoate, α-cumylperoxyneodecanoate, t-amylperoxy-2-ethylhexanoate, t-butylperoxyisobutyrate, di-t-butylperoxyhexahydroterephthalate, di-t-butylperoxytrimethyladipate, di-3-methoxybutylperoxydicarbonate, di-isopropylperoxydicarbonate, t-butylperoxyisopropylcarbonate, 1,6-bis(t-butylperoxycarbonyloxy)hexane, diethylene glycol bis(t-butylperoxycarbonate) and t-hexylperoxyneodecanoate.

Examples of the organic azo compound include azonitrile compounds such as "V-30", "V-40", "V-59", "V-60", "V-65" and "V-70", azoamide compounds such as "VA-080", "VA-085", "VA-086", "VF-096", "VAm-110" and "VAm-111", cyclic azoamidine compounds such as "VA-044" and "VA-061", and azoamidine compounds such as "V-50" and VA-057" (each, trade name; commercially available from Wako Pure Chemical Industries), 2,2-azobis(4-methoxy-2,4-dimethylvaleronitrile), 2,2-azobis(2,4-dimethylvaleronitrile), 2,2-azobis(2-methylpropionitrile), 2,2-azobis(2,4-dimethylbutyronitrile), 1,1-azobis(cyclohexane-1-carbonitrile), 1-[(1-cyano-1-methylethyl)azo]formamide, 2,2-azobis{2-methyl-N-1,1-bis(hydroxymethyl)-2-hydroxyethyl]propionamide}, 2,2-azobis[2-methyl-N-(2-hydroxybutyl)propionamide], 2,2-azobis[N-(2-propenyl)-2-methylpropionamide], 2,2-azobis(N-butyl-2-methylpropionamide), 2,2-azobis(N-cyclohexyl-2-methylpropionamide), 2,2-azobis[2-(2-imidazolin-2-yl)propane]dihydrochloride, 2,2-azobis[2-(2-imidazolin-2-yl)]propane]disulfate dihydrate, 2,2-azobis{2-[1-(2-hydroxyethyl)-2-imidazolin-2-yl]propane}dihydrochloride, 2,2-azobis[2-[2-imidazolin-2-yl]propane], 2,2-azobis(1-imino-1-pyrrolidino-2-methylpropane)dihydrochloride, 2,2-azobis(2-methylpropionadine)dihydrochloride, 2,2-azobis[N-(2-carboxyethyl)-2-methylpropionamidine]tetrahydrate, dimethyl-2,2-azobis(2-methylpropionate), 4,4-azobis(4-cyanovaleric acid) and 2,2-azobis(2,4,4-trimethylpentane).

In the invention, these polymerization initiators may be used either singly or as a mixture.

The amount of the polymerization initiator in the invention is preferably from 0.001 to 2 moles, more preferably from 0.01 to 1 mole, especially preferably from 0.05 to 0.5 mole, per mole of a monomer.

In the invention, the polymerization reaction of a monomer may be effected preferably in the presence of a transition metal catalyst. For example, it is preferred to carry out polymerization of a monomer having a polymerizable carbon-carbon double bond or carbon-carbon triple bond, for example, in the presence of a Pd catalyst such as $Pd(PPh_3)_4$ or $Pd(OAc)_2$, a Ziegler-Natta catalyst, an Ni catalyst such as nickel acetyl acetonate, a W catalyst such as $WCl_6$, an Mo catalyst such as $MoCl_5$, a Ta catalyst such as $TaCl_5$, an Nb catalyst such as $NbCl_5$, an Rh catalyst or a Pt catalyst.

In the invention, these transition metal catalysts may be used either singly or as a mixture.

In the invention, the amount of the transition metal catalyst is preferably from 0.001 to 2 moles, more preferably from 0.01 to 1 mole, especially preferably from 0.05 to 0.5 mole per mole of the monomer.

In the field of electronic materials, there is a fear of a metal mixed in products as an impurity adversely affecting the performance of the products so that a non-metallic polymerization initiator is more preferred as a polymerization accelerating additive.

As the solvent to be used in the polymerization reaction, any solvent is usable insofar as it can dissolve a raw material monomer therein at a required concentration and has no adverse effect on the properties of a film formed from the resulting polymer. Examples include water, alcohol solvents such as methanol, ethanol and propanol, ketone solvents such as acetone, methyl ethyl ketone, methyl isobutyl ketone, cyclohexanone and acetophenone; ester solvents such as ethyl acetate, butyl acetate, propylene glycol monomethyl ether acetate, γ-butyrolactone and methyl benzoate; ether solvents such as dibutyl ether, anisole and tetrahydrofuran; aromatic hydrocarbon solvents such as toluene, xylene, mesitylene, and 1,3,5-tri-t-butylbenzene; amide solvents such as N-methylpyrrolidinone and dimethylacetamide; halogen solvents such as carbon tetrachloride, dichloromethane, chloroform, 1,2-dichloroethane, chlorobenzene, 1,2-dichlorobenzene and 1,2,4-trichlorobenzene; and aliphatic hydrocarbon solvents such as hexane, heptane, octane and cyclohexane. Of these solvents, preferred are acetone, methyl ethyl ketone, methyl isobutyl ketone, cyclohexanone, acetophenone, ethyl acetate, propylene glycol monomethyl ether acetate, γ-butyrolactone, anisole, tetrahydrofuran, toluene, xylene, mesitylene, 1,3,5-triisopropylbenzene, 1,2-dichloroethane, chlorobenzene, 1,2-dichlorobenzene and 1,2,4-trichlorobenzene, of which tetrahydrofuran, γ-butyrolactone, anisole, toluene, xylene, mesitylene, 1,3,5-triisopropylbenzene, 1,2-dichloroethane, chlorobenzene, 1,2-dichlorobenzene, and 1,2,4-trichlorobenzene are more preferred and γ-butyrolactone, anisole, mesitylene, 1,3,5-triisopropylbenzene, 1,2-dichlorobenzene and 1,2,4-trichlorobenzene are especially preferred. These solvents may be used either singly or as a mixture.

The monomer concentration in the reaction mixture is preferably from 1 to 50 mass %, more preferably from 5 to 30 mass %, especially preferably from 10 to 20 mass %.

The conditions most suited for the polymerization reaction in the invention differ, depending on the kind or concentration of the polymerization initiator, monomer or solvent. The polymerization reaction is performed preferably at a bulk temperature of from 0 to 200° C., more preferably from 40 to 180° C., especially preferably from 80 to 150° C. The reaction time is preferably from 1 to 50 hours, more preferably from 2 to 20 hours, especially preferably from 3 to 10 hours.

To suppress the inhibition of polymerization which will otherwise occur by oxygen, the reaction is performed preferably in an inert gas atmosphere (for example, nitrogen or argon). The oxygen concentration upon reaction is preferably 100 ppm or less, more preferably 50 ppm or less, especially preferably 20 ppm or less.

The polymer of the invention has a weight average molecular weight of preferably from 1,000 to 500,000, more preferably from 5,000 to 200,000, especially preferably from 10,000 to 100,000.

The polymer of the invention may be incorporated in the film forming composition as a resin composition having a molecular weight distribution.

<Compound Having a Conjugated Diene Structure>

The compound having a conjugated diene structure according to the invention may be either a low molecular compound or high molecular compound insofar as it has at least one conjugated diene structure. It is preferably a low molecular compound having a molecular weight of from 50 to 20,000, more preferably a compound having a molecular weight of from 50 to 10,000, still more preferably a compound having a molecular weight of from 50 to 5,000.

The compound having a conjugated diene structure according to the invention is preferably contained in an amount of from 0.1 to 100 parts by mass, more preferably from 0.5 to 50 parts by mass, especially preferably from 1 to 40 parts by mass based on 100 parts by mass of the whole solid content.

The low molecular compound having a conjugated diene structure usable in the invention may be a linear compound, a chain compound having a branch or a compound having a cyclic structure. The compound having a conjugated diene structure according to the invention may have, in addition to carbon and hydrogen, a hetero atom such as oxygen, nitrogen, sulfur or halogen, but is preferably a hydrocarbon compound composed of carbon and hydrogen.

Preferred specific examples of the low molecular compound having a conjugated diene structure usable in the invention include 1,3-butadiene, isoprene, 2,3-dimethylbutadiene, 1,3-pentadiene, cis-piperylene, trans-piperylene, trans-2-methyl-1,3-pentadiene, 3-methyl-1,3-pentadiene, 2,4-dimethyl-1,3-pentadine, 1,3-hexadiene, 2,4-hexadiene, 2,5-dimethyl-2,4-hexadiene, 1,3,5-hexatriene, 2,6-dimethyl-2,4,6-octatriene, myrcene, 1,3-cyclohexadiene, 1,3-cycloheptadiene, cis,cis-1,3-cyclooctadiene, 1,2,3,4-tetramethyl-1,3-cyclopentadiene, 1,2,3,4,5-pentamethyleyclopentadiene, ethyltetramethylcyclopentadiene, α-terpinene, cycloheptatriene, (5R)-5-isopropyl-2-methyl-1,3-cyclohexadiene, (5,5-dimethyl-4-phenyl-1,3-cyclopentadien-1-yl)benzene, [2,4-cyclopentadien-1-ylidene(phenyl)methyl]benzene, cyclooctatetraene, 6,6-dimethylfulvalene, and

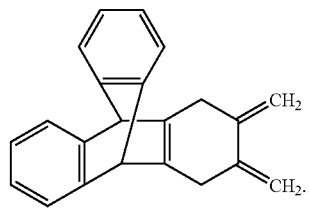

The film forming composition of the invention may contain a solvent and it may be used as a coating solution. Although no particular limitation is imposed on the solvent, examples include alcohol solvents such as methanol, ethanol, 2-propanol, 1-butanol, 2-ethoxymethanol, 3-methoxypropanol and 1-methoxy-2-propanol; ketone solvents such as acetone, acetylacetone, methyl ethyl ketone, methyl isobutyl ketone, 2-pentanone, 3-pentanone, 2-heptanone, 3-heptanone, cyclopentanone and cyclohexanone; ester solvents such as ethyl acetate, propyl acetate, butyl acetate, isobutyl acetate, pentyl acetate, ethyl propionate, propyl propionate, butyl propionate, isobutyl propionate, propylene glycol monomethyl ether acetate, methyl lactate, ethyl lactate and γ-butyrolactone; ether solvents such as diisopropyl ether, dibutyl ether, ethyl propyl ether, anisole, phenetole and veratrole; aromatic hydrocarbon solvents such as mesitylene, ethylbenzene, diethylbenzene, propylbenzene and t-butylbenzene; and amide solvents such as N-methylpyrrolidinone and dimethylacetamide. These solvents may be used either singly or as a mixture.

Of these solvents, more preferred are 1-methoxy-2-propanol, propanol, acetylacetone, cyclohexanone, propylene glycol monomethyl ether acetate, butyl acetate, methyl lactate, ethyl lactate, γ-butyrolactone, anisole, mesitylene, and t-butylbenzene, with 1-methoxy-2-propanol, cyclohexanone, propylene glycol monomethyl ether acetate, ethyl lactate, γ-butyrolactone, t-butylbenzene and anisole being especially preferred.

The total solid concentration of the film forming composition of the invention is preferably from 0.1 to 50 mass %, more preferably from 1.0 to 20 mass %, especially preferably from 2.0 to 10 mass %.

The "total solid content" as used herein corresponds to all the components constituting an insulating film available using the composition.

The solubility, in a solvent, of the polymer to be used in the invention is preferably higher in order to prevent precipitation of an insoluble matter when the coating solution is stored. The solubility at 25° C. in cyclohexanone or anisole is preferably 3 mass % or greater, more preferably 5 mass % or greater, especially preferably 10 mass % or greater.

The content of metals, as an impurity, of the film forming composition of the invention is preferably as small as possible. The metal content of the film forming composition can be measured with high sensitivity by the ICP-MS and in this case, the content of metals other than transition metals is preferably 30 ppm or less, more preferably 3 ppm or less, especially preferably 300 ppb or less. The content of the transition metal is preferably as small as possible because it accelerates oxidation by its high catalytic capacity and the oxidation reaction in the prebaking or thermosetting process decreases the dielectric constant of the film obtained by the invention. The metal content is preferably 10 ppm or less, more preferably 1 ppm or less, especially preferably 100 ppb or less.

The metal concentration of the film forming composition can also be evaluated by subjecting a film obtained using the film forming composition of the invention to total reflection fluorescent X-ray analysis. When W ray is employed as an X-ray source, the metal concentrations of metal elements such as K, Ca, Ti, Cr, Mn, Fe, Co, Ni, Cu, Zn, and Pd can be measured. The concentrations of them are each preferably from $100 \times 10^{10}$ atom·cm$^{-2}$ or less, more preferably $50 \times 10^{10}$ atom·cm$^{-2}$ or less, especially preferably $10 \times 10^{10}$ atom·cm$^{-2}$ or less. In addition, the concentration of Br as a halogen can be measured. Its remaining amount is preferably $10000 \times 10^{10}$ atom·cm$^{-2}$ or less, more preferably $1000 \times 10^{10}$ atom·cm$^{-2}$, especially preferably $400 \times 10^{10}$ atom·cm$^{-2}$. Moreover, the concentration of Cl can also be observed as a halogen. In order to prevent it from damaging a CVD device, etching device or the like, its remaining amount is preferably $100 \times 10^{10}$ atom·cm$^{-2}$ or less, more preferably $50 \times 10^{10}$ atom·cm$^{-2}$, especially preferably $10 \times 10^{10}$ atom·cm$^{-2}$.

To the film forming composition of the invention, additives such as radical generator, colloidal silica, surfactant and adhesion accelerator may be added in an amount so as not to impair the physical properties (such as heat resistance, dielectric constant, mechanical strength, coatability and adhesion) of the resulting insulating film.

In the invention, a surfactant may be added. Examples of the surfactant include nonionic surfactants, anionic surfactants, and cationic surfactants. Additional examples include silicone surfactants, fluorine-containing surfactants, polyalkylene-oxide surfactants, and acrylic surfactants. In the invention, these surfactants may be used either singly or in combination. Of these, silicone surfactants, nonionic surfactants, fluorine-containing surfactants and acrylic surfactants are preferred, with silicone surfactants being especially preferred.

In the invention, the amount of the surfactant to be added is preferably 0.01 mass % or greater but not greater than 1 mass %, more preferably 0.1 mass % or greater but not greater than 0.5 mass %, based on the total amount of the film forming composition.

Any silane coupling agent may be used in the invention. Examples include 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltrimethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3- aminopropyltriethoxysilane, N-phenyl-3-aminopropyltrimethoxysilane, N-phenyl3-aminopropyltriethoxysilane, N-bis(oxyethylene)-3-aminopropyltrimethoxysilane, and N-bis(oxyethylene)-3-aminopropyltriethoxysilane. Those silane coupling agents may be used either singly or in combination. The silane coupling agent may be added preferably in an amount of 10 parts by weight or less, especially preferably from 0.05 to 5 parts by weight based on 100 parts by weight of the whole solid content.

In the invention, any adhesion accelerator may be used. Examples include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane, trimethoxyvinylsilane, γ-aminopropyltriethoxysilane, aluminum monoethylacetoacetate disopropylate, vinyltris(2-methoxyethoxy)silane, N-(2-aminoethyl)-3-aminopropylmethyldimethoxysilane, N-(2-aminoethyl)-3-aminopropyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, trimethylchlorosilane, dimethylvinylchlorosilane, methyldiphenylchlorosilane, chloromethyldimethylchlorosilane, trimethylmethoxysilane, dimethyldiethoxysilane, methyldimethoxysilane, dimethylvinylethoxysilane, diphenyldimethoxysilane, phenyltriethoxysilane, hexamethyldisilazane, N,N'-bis(trimethylsilyl)urea, dimethyltrimethylsilylamine, trimethylsilylimidazole, vinyltrichlorosilane, benzotriazole, benzimidazole, indazole, imidazole, 2-mercaptobenzimidazole, 2-mercaptobenzothiazole, 2-mercaptobenzoxazole, urazole, thiourasil, mercaptoimidazole, mercaptopyrimidine, 1,1-dimethylurea, 1,3-dimethylurea and thiourea compounds. A functional silane coupling agent is preferred as an adhesion accelerator. The amount of the adhesion accelerator is preferably 10 parts by weight or less, especially preferably from 0.05 to 5 parts by weight, based on 100 parts by weight of the total solid content.

It is possible to add a pore forming factor to the composition of the invention to the extent allowed by the mechanical strength of a film in order to make a film porous and thereby reduce the dielectric constant thereof.

Although the pore forming factor which will be an additive serving as a pore forming agent is not particularly limited, non-metallic compounds are preferred. They must satisfy both solubility in the solvent used for a film forming coating solution and compatibility with the polymer of the invention.

A polymer may also be used as the pore forming agent. Examples of the polymer usable as the pore forming agent include aromatic polyvinyl compounds (such as polystyrene, polyvinylpyridine, and halogenated aromatic polyvinyl compound), polyacrylonitrile, polyalkylene oxides (such as polyethylene oxide and polypropylene oxide), polyethylene, polylactic acid, polysiloxane, polycaprolactone, polycaprolactam, polyurethane, polymethacrylates (such as polymethyl methacrylate), polymethacrylic acid, polyacrylates (such as polymethyl acrylate), polyacrylic acid, polydienes (such as polybutadiene and polyisoprene), polyvinyl chloride, polyacetal, amine-capped alkylene oxides, polyphenylene oxide, poly(dimethylsiloxane), polytetrahydrofuran, polycyclohexylethylene, polyethyloxazoline, polyvinylpyridine, and polycaprolactone.

Polystyrene is especially preferred as the pore forming agent. Examples of the polystyrene include anionically polymerized polystyrene, syndiotactic polystyrene and unsubstituted and substituted polystyrenes (such as poly(α-methylstyrene)), among which the non-substituted polystyrene is preferred.

Thermoplastic polymers may also be used as the pore forming agent. Examples of the thermoplastic pore-forming polymer include polyacrylate, polymethacrylate, polybutadiene, polyisoprene, polyphenylene oxide, polypropylene oxide, polyethylene oxide, poly(dimethylsiloxane), polytetrahydrofuran, polyethylene, polycyclohexylethylene, polyethyloxazoline, polycaprolactone, polylactic acid and polyvinylpyridine.

Such pore forming agent has a boiling point or decomposition point of preferably from 100 to 500° C., more preferably from 200 to 450° C., especially preferably from 250 to 400° C. The molecular weight thereof is preferably from 200 to 50,000, more preferably from 300 to 10,000, especially preferably from 400 to 5,000. The pore forming agent is added in an amount, in terms of mass % relative to the film-forming polymer, of preferably from 0.5 to 75%, more preferably from 0.5 to 30%, especially preferably from 1 to 20%.

The polymer may contain a decomposable group as a pore forming factor. The decomposition point thereof is preferably from 100 to 500° C., more preferably from 200 to 450° C., especially from 250 to 400° C. The content of the decomposable group is, in terms of mole % relative to the amount of the monomer in the film-forming polymer, preferably from 0.5 to 75%, more preferably from 0.5 to 30%, especially preferably from 1 to 20%.

The film can be formed by applying the film forming composition of the invention onto a substrate by a desired method such as spin coating, roller coating, dip coating or scan coating, and then heating the substrate to remove the solvent. For drying off the solvent, the substrate is heated preferably for 0.1 to 10 minutes at from 40 to 250° C.

As the method of applying the composition to the substrate, spin coating and scan coating are preferred, with spin coating being especially preferred. For spin coating, commercially available apparatuses such as "Clean Track Series" (trade name; product of Tokyo Electron), "D-spin Series" (trade name; product of Dainippon Screen), or "SS series" or "CS series" (each, trade name; product of Tokyo Oka Kogyo) are preferably employed. The spin coating may be performed at any rotation speed, but from the viewpoint of in-plane uniformity of the film, a rotation speed of about 1300 rpm is preferred for a 300-mm silicon substrate.

When the solution of the composition is discharged, either dynamic discharge in which the solution is discharged onto a rotating substrate or static discharge in which the solution is discharged onto a static substrate may be employed. The dynamic discharge is however preferred in view of the in-plane uniformity of the film. Alternatively, from the viewpoint of reducing the consumption amount of the composition, a method of discharging only a main solvent of the composition to a substrate in advance to form a liquid film and then discharging the composition thereon can be employed. Although no particular limitation is imposed on the spin coating time, it is preferably within 180 seconds from the viewpoint of throughput. From the viewpoint of the transport of the substrate, it is preferred to subject the substrate to processing (such as edge rinse or back rinse) for preventing the film from remaining at the edge portion of the substrate.

The heat treatment method is not particularly limited, but ordinarily employed methods such as hot plate heating, heating with a furnace, heating in an RTP (Rapid Thermal Processor) to expose the substrate to light of for example, a xenon lamp can be employed. Of these, hot plate heating or heating with a furnace is preferred. As the hot plate, a commercially available one, for example, "Clean Track Series" (trade name; product of Tokyo Electron), "D-spin Series" (trade name; product of Dainippon Screen) and "SS series" or "CS series" (trade name; product of Tokyo Oka Kogyo) is preferred, while as the furnace, "α series" (trade name; product of Tokyo Electron) is preferred.

It is especially preferred to apply the polymer of the invention onto a substrate and then heating to cure it. For this purpose, the polymerization reaction, at the time of post heating, of a carbon-carbon double bond or a carbon-carbon triple bond remaining in the polymer may be utilized. The post heat treatment is performed preferably at from 100 to 450° C., more preferably at from 200 to 420° C., especially preferably at from 350 to 400° C., preferably for from 1 minute to 2 hours, more preferably for from 10 minutes to 1.5 hours, especially preferably for from 30 minutes to 1 hour. The post heat treatment may be performed in several times. This post heat treatment is performed especially preferably in a nitrogen atmosphere in order to prevent thermal oxidation due to oxygen.

In the invention, the polymer may be cured not by heat treatment but by exposure to high energy radiation to cause polymerization reaction of a carbon-carbon double bond or carbon-carbon triple bond remaining in the polymer. Examples of the high energy radiation include electron beam, ultraviolet ray and X ray. The curing method is not particularly limited to these methods.

When electron beam is employed as high energy radiation, the energy is preferably from 0 to 50 keV, more preferably from 0 to 30 keV, especially preferably from 0 to 20 keV. Total dose of electron beam is preferably from 0 to 5 $\mu C/cm^2$ or less, more preferably from 0 to 2 $\mu C/cm^2$, especially preferably from 0 to 1 $\mu C/cm^2$ or less. The substrate temperature when it is exposed to electron beam is preferably from 0 to 450° C., more preferably from 0 to 400° C., especially preferably from 0 to 350° C. Pressure is preferably from 0 to 133 kPa, more preferably from 0 to 60 kPa, especially preferably from 0 to 20 kPa. The atmosphere around the substrate is preferably an atmosphere of an inert gas such as Ar, He or nitrogen from the viewpoint of preventing oxidation of the polymer of the invention. An oxygen, hydrocarbon or ammonia gas may be added for the purpose of causing reaction with plasma, electromagnetic wave or chemical species which is generated by the interaction with electron beam. In the invention, exposure to electron beam may be carried out in plural times. In this case, the exposure to electron beam is not necessarily carried out under the same conditions but the conditions may be changed every time.

Ultraviolet ray may be employed as high energy radiation. The radiation wavelength range of the ultraviolet ray is preferably from 190 to 400 nm, while its output immediately above the substrate is preferably from 0.1 to 2000 mWcm$^{-2}$. The substrate temperature upon exposure to ultraviolet ray is preferably from 250 to 450° C., more preferably from 250 to 400° C., especially preferably from 250 to 350° C. The atmosphere around the substrate is preferably an atmosphere of an inert gas such as Ar, He or nitrogen from the viewpoint of preventing oxidation of the polymer of the invention. The pressure at this time is preferably from 0 to 133 kPa.

When the film obtained using the film forming composition of the invention is used as an interlayer insulating film for semiconductor, a barrier layer for preventing metal migration may be disposed on the side of an interconnect. In addition, a cap layer, an interlayer adhesion layer or etching stopping layer may be disposed on the upper or bottom surface of the interconnect or interlayer insulating film to prevent exfoliation at the time of CMP (Chemical Mechanical Polishing). Moreover, the layer of an interlayer insulating film may be composed of plural layers using another material as needed.

The film obtained using the film forming composition of the invention can be etched for copper interconnection or another purpose. Either wet etching or dry etching can be employed, but dry etching is preferred. For dry etching, either ammonia plasma or fluorocarbon plasma can be used as needed. For the plasma, not only Ar but also a gas such as oxygen, nitrogen, hydrogen or helium can be used. Etching may be followed by ashing for the purpose of removing a photoresist or the like used for etching. Moreover, the ashing residue may be removed by washing.

The film obtained using the film forming composition of the invention may be subjected to CMP for planarizing the copper plated portion after copper interconnection. As a CMP slurry (chemical solution), a commercially available one (for example, product of Fujimi Incorporated, Rodel Nitta, JSR or Hitachi Chemical) can be used as needed. As a CMP apparatus, a commercially available one (for example, product of Applied Material or Ebara Corporation) can be used as needed. After CMP, the film can be washed in order to remove the slurry residue.

The film available using the film forming composition of the invention can be used for various purposes. For example, it is suited for use as an insulating film in semiconductor devices such as LSI, system LSI, DRAM, SDRAM, RDRAM and D-RDRAM, and in electronic devices such as multi-chip module multi-layered wiring board. It can also be used as a passivation film or an α-ray shielding film for LSI, a coverlay film for flexographic printing plate, an overcoat film, a cover coating for a flexible copper-clad board, a solder resist film, and a liquid crystal alignment film as well as an interlayer insulating film for semiconductor, an etching stopper film, a surface protective film, and a buffer coating film.

EXAMPLES

Example 1

In accordance with the synthesis process as described in *Macromolecules,* 5266(1991), 4,9-diethynyldiamantane was synthesized. Under a nitrogen gas stream, 2 g of the resulting 4,9-diethynyldiamantane, 0.4 g of dicumyl peroxide ("PERCUMYL D", trade name; product of NOF) and 10 ml of orthodichlorobenzene were stirred for 5 hours at a bulk temperature of 140° C. for polymerization. The reaction mixture was cooled to room temperature and then added to 100 ml of methanol. A solid thus precipitated was collected by filtration and rinsed with methanol, whereby 1.0 g of Polymer (A) having a mass average molecular weight of about 14,000 was obtained.

In 9 g of 2,3-dimethyl-1,3-butadiene (product of Aldrich) was dissolved 1.0 g of Polymer (A) thus obtained. The resulting solution was stirred at 60° C. for 1 hour, followed by heating and drying at 200° C. for 1 hour in a nitrogen atmosphere to obtain 1.1 g of Compound (B).

A coating solution was prepared by completely dissolving 0.90 g of the resulting compound (B) in 10 g of cyclohexanone. The resulting solution was filtered through a 0.1-μm filter made of tetrafluoroethylene, followed by spin coating on a silicon wafer. The coat thus obtained was heated at 200°

C. for 60 seconds on a hot plate in a nitrogen gas stream and then baked for 60 minutes in an oven of 400° C. purged with nitrogen, whereby a 0.5-μm thick uniform film free from seeding was obtained. The film was stored in a thermo-hygrostat of 45° C. and 90% RH for 24 hours and then exposed to the air at 200° C. for 1 minute. The relative dielectric constant of the film was calculated from the capacitance value at 1 MHz by using a mercury probe (product of Four Dimensions) and an LCR meter "HP4285A" (trade name; product of Yokogawa Hewlett-Packard). The relative dielectric constant was 2.39, though it was 2.38 just after the film formation. This has suggested that even under oxidation promotion conditions, no change occurred in a relative dielectric constant. In addition, no peak derived from the oxidation was found in the FT-IR spectrum.

Example 2

A coating solution was prepared and a film was formed in a similar manner to Example 1 except that cyclopentadiene (product of Aldrich) was used instead of 2,3-dimethyl-1,3-butadiene, whereby a 0.5-μm thick uniform film without seeding was obtained. The film was stored in a thermo-hygrostat of 45° C. and 90% RH for 24 hours and then exposed to the air at 200° C. for 1 minute. The relative dielectric constant of the film was calculated from the capacitance value at 1 MHz by using a mercury probe product of Four Dimensions) and an LCR meter "HP4285A" (trade name; product of Yokogawa Hewlett-Packard). As a result, the relative dielectric constant was found to be 2.40, though it was 2.39 just after film formation. This has suggested that even under oxidation promotion conditions, no change occurred in a relative dielectric constant. In addition, no peak derived from the oxidation was found in the FT-IR spectrum.

Example 3

A coating solution was prepared and a film was formed in a similar manner to Example 1 except that 1,3-cyclohexadiene (product of Aldrich) was used instead of 2,3-dimethyl-1, 3-butadiene, whereby a 0.5-μm thick uniform film without seeding was obtained. The film was stored in a thermo-hygrostat of 45° C. and 90% RH for 24 hours and then exposed to the air at 200° C. for 1 minute. The relative dielectric constant of the film was calculated from the capacitance value at 1 MHz by using a mercury probe (product of Four Dimensions) and an LCR meter "HP4285A" (trade name; product of Yokogawa Hewlett-Packard). As a result, the relative dielectric constant was found to be 2.39, though it was 2.38 just after film formation. This has suggested that even under oxidation promotion conditions, no change occurred in a relative dielectric constant. In addition, no peak derived from the oxidation was found in the FT-IR spectrum.

Example 4

A coating solution was prepared and a film was formed in a similar manner to Example 1 except that 1,3-cyclooctadiene product of Aldrich) was used instead of 2,3-dimethyl-1,3-butadiene, whereby a 0.5-μm thick uniform film without seeding was obtained. The film was stored in a thermo-hygrostat of 45° C. and 90% RH for 24 hours and then exposed to the air at 200° C. for 1 minute. The relative dielectric constant of the film was calculated from the capacitance value at 1 MHz by using a mercury probe (product of Four Dimensions) and an LCR meter "HP4285A" (trade name; product of Yokogawa Hewlett-Packard). As a result, the relative dielectric constant was found to be 2.39, though it was 2.38 just after film formation. This has suggested that even under oxidation promotion conditions, no change occurred in a relative dielectric constant. In addition, no peak derived from the oxidation was found in the FT-IR spectrum.

Comparative Example 1

A coating solution was prepared in a similar manner of Example 1 except that 0.90 g of Polymer (A) instead of 0.90 g of Compound (B) was completely dissolved in 10 g of cyclohexanone. A film was formed by the application of the coating solutions whereby a 0.5-μm thick uniform film without seeding was obtained. The film was stored in a thermo-hygrostat of 45° C. and 90% RH for 24 hours and then exposed to the air at 200° C. for 1 minute. The relative dielectric constant of the film was calculated from the capacitance value at 1 MHz by using a mercury probe (product of Four Dimensions) and an LCR meter "HP4285A" (trade name; product of Yokogawa Hewlett-Packard). As a result, the relative dielectric constant was found to be 2.62, though it was 2.41 just after film formation. This has suggested that a change occurred in a relative dielectric constant under oxidation promotion conditions. In addition, a marked peak derived from the oxidation was found in the FT-IR spectrum.

The invention makes it possible to form a film that has a low dielectric constant, excellent film properties such as Young's modulus, and also excellent durability and is therefore suited for use as an interlayer insulating film in semiconductor devices or a low refractive index film in optical devices.

The invention also makes it possible to provide an electronic device having the film as a constituent layer such as interlayer insulating film.

The entire disclosure of each and every foreign patent application from which the benefit of foreign priority has been claimed in the present application is incorporated herein by reference, as if fully set forth.

What is claimed is:
1. An insulating film forming composition comprising:
a compound having a cage structure; and
a compound having a conjugated diene structure composed of carbon and hydrogen,
wherein the compound having a cage structure is obtained by polymerizing, in the presence of a transition metal catalyst or radical polymerization initiator, a monomer selected from the group consisting of compounds represented by the following formulas (I) to (VI):

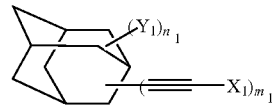

formula (I)

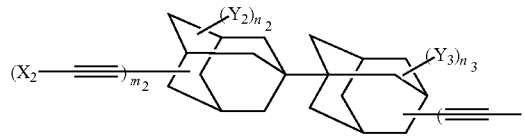

formula (II)

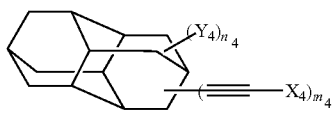

formula (III)

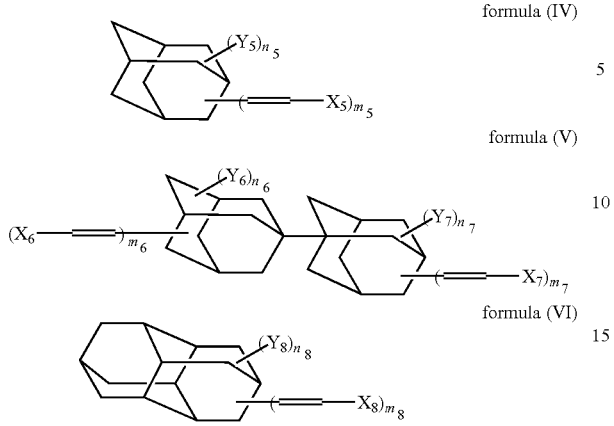

wherein $X_1$ to $X_8$ each independently represents a hydrogen atom, a $C_{1-10}$ alkyl group, a $C_{2-10}$ alkenyl group, a $C_{2-10}$ alkynyl group, a $C_{6-20}$ aryl group, a $C_{0-20}$ silyl group, a $C_{2-10}$ acyl group, a $C_{2-10}$ alkoxycarbonyl group or a $C_{1-20}$ carbamoyl group, $Y_1$ to $Y_8$ each independently represents a halogen atom, a $C_{1-10}$ alkyl group, a $C_{6-20}$ aryl group or a $C_{0-20}$ silyl group, $m_1$ and $m_5$ each independently represents an integer of from 1 to 16, $n_1$ and $n_5$ each independently represents an integer of from 0 to 15, $m_2$, $m_3$, $m_6$ and $m_7$ each independently represents an integer of from 1 to 15, $n_2$, $n_3$, $n_6$ and $n_7$ each independently represents an integer of from 0 to 14, $m_4$ and $m_8$ each independently represents an integer of from 1 to 20, and $n_4$ and $n_8$ each independently represents an integer of from 0 to 19, or the compound having a cage structure has a polyene structure.

2. The film forming composition according to claim 1, wherein the compound having a cage structure has a solubility at 25° C. of 3 mass % or greater in cyclohexanone or anisole.

3. The film forming composition according to claim 1, further comprising:

an organic solvent.

4. An electronic device comprising the insulating film forming composition according to claim 1.

* * * * *